United States Patent
Harrington et al.

[11] Patent Number: 6,134,168
[45] Date of Patent: Oct. 17, 2000

[54] CIRCUIT AND METHOD FOR INTERNAL REFRESH COUNTER

[75] Inventors: Matthew R. Harrington, Sugar Land; Steven C. Eplett, Houston, both of Tex.; Kallol Mazumder, Calcutta, India; Scott E. Smith, Sugar Land, Tex.

[73] Assignee: Texas Instruments Incorporated, Dallas, Tex.

[21] Appl. No.: 09/327,734

[22] Filed: Jun. 8, 1999

Related U.S. Application Data

[60] Provisional application No. 60/044,905, Apr. 25, 1997, and provisional application No. 60/046,073, May 9, 1997.

[51] Int. Cl.[7] .................................................. G11C 7/00
[52] U.S. Cl. ........................................ 365/222; 365/230.06
[58] Field of Search ................................ 365/222, 230.06

[56] References Cited

U.S. PATENT DOCUMENTS

| | | | |
|---|---|---|---|
| 4,459,660 | 7/1984 | Bellay et al. | 364/200 |
| 5,210,717 | 5/1993 | Tamaki | 365/222 |
| 5,255,378 | 10/1993 | Crawford et al. | 395/325 |
| 5,365,487 | 11/1994 | Patel et al. | 365/226 |
| 5,703,828 | 12/1997 | Park et al. | 365/230.03 |
| 5,835,956 | 11/1998 | Park et al. | 711/167 |

FOREIGN PATENT DOCUMENTS

| | | |
|---|---|---|
| 0 520 650 A1 | 6/1992 | European Pat. Off. . |
| 2 239 113 | 6/1991 | United Kingdom . |

OTHER PUBLICATIONS

"Low Power Architecture Design and Compilation Techniques for High–Performance Processors", Su, et. al., Advanced Computer Architecture Laboratory, University of Southern California, 1994, pp. 489–498.

*Primary Examiner*—Vu A. Le
*Attorney, Agent, or Firm*—Robert N. Rountree; Michael K. Skrehot; Richard L. Donaldson

[57] ABSTRACT

A counter (450) for generating a series of binary addresses, each of the addresses including a set of one or more most-significant bits. The counter includes circuitry to generate the addresses, including the set of most-significant bits (402), in a first mode and circuitry to generate the addresses (400), excluding the set of most significant bits, in a second mode. The counter is operable to transition between the first and second modes. The counter also includes circuitry to generate the addresses in the first mode in a non-binary count order in which the set of most-significant address bits is a set of least-significant bits in the count order.

8 Claims, 15 Drawing Sheets

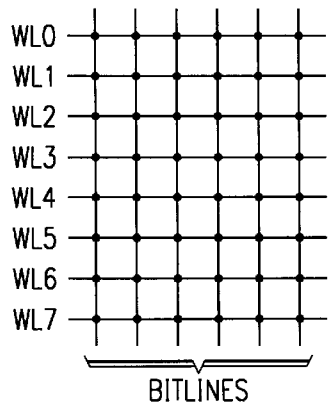
FIG. 1
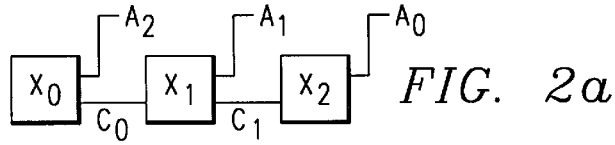
FIG. 2a
| | $A_2$ | $A_1$ | $A_0$ |
|---|---|---|---|
| WL0 | 0 | 0 | 0 |
| WL1 | 0 | 0 | 1 |
| WL2 | 0 | 1 | 0 |
| WL3 | 0 | 1 | 1 |
| WL4 | 1 | 0 | 0 |
| WL5 | 1 | 0 | 1 |
| WL6 | 1 | 1 | 0 |
| WL7 | 1 | 1 | 1 |
FIG. 2b
| | $A_1$ | $A_0$ | $A_2$ |
|---|---|---|---|
| WL0 | 0 | 0 | 0 |
| WL1 | 0 | 1 | 0 |
| WL2 | 1 | 0 | 0 |
| WL3 | 1 | 1 | 0 |
| WL4 | 0 | 0 | 1 |
| WL5 | 0 | 1 | 1 |
| WL6 | 1 | 0 | 1 |
| WL7 | 1 | 1 | 1 |
FIG. 2c
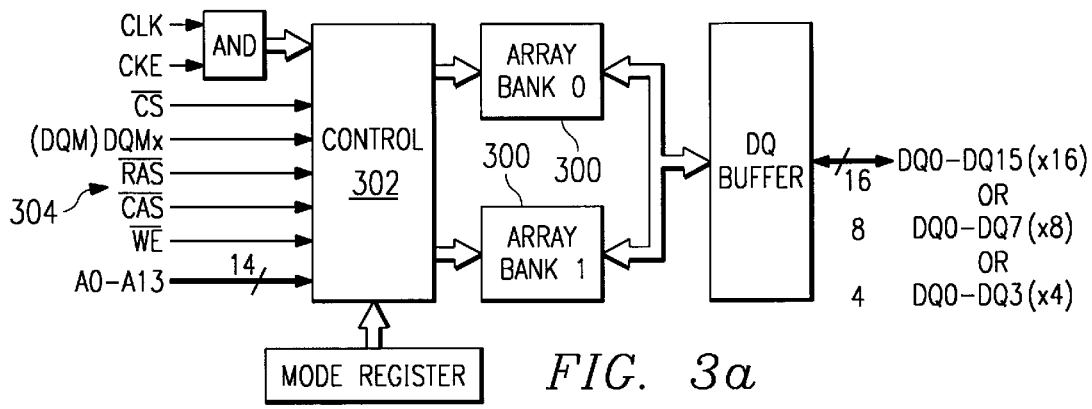
FIG. 3a
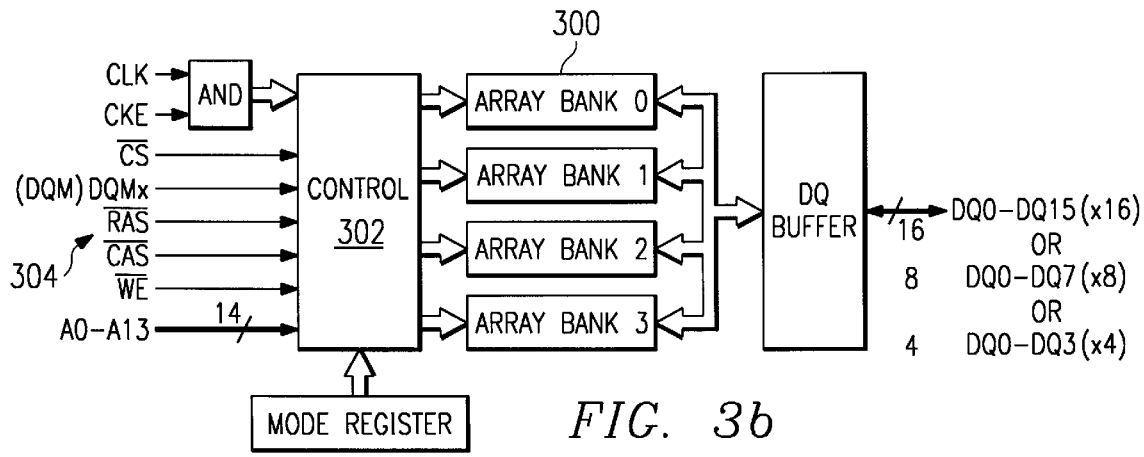
FIG. 3b i# CIRCUIT AND METHOD FOR INTERNAL REFRESH COUNTER This application claims priority under 35 U.S.C. § 119 (e)(1) of provisional application No. 60/044,905, filed Apr. 25, 1997 and provisional application No. 60/046,073, filed May 9, 1997.

FIELD OF THE INVENTION

This invention generally relates to semiconductor integrated circuits, and more specifically to memory integrated circuits.

BACKGROUND OF THE INVENTION

Dynamic random access memory circuits (DRAMs) are "dynamic" in the sense that the stored data, typically in the form of charged and discharged capacitors or memory cells arranged in a large array, will dissipate after a relatively short period of time. Thus, in order to retain the information, the contents of the DRAM must be refreshed; that is, the charged or discharged state of the capacitor must be reapplied to each individual memory cell in a repetitive manner. The maximum amount of time allowable between refreshing operations is determined by the charge storage capabilities of the capacitors that make up the memory cell array. The memory circuit manufacturer typically specifies a refresh time for which it guarantees data retention in the memory cells.

Memory cell arrays are typically arranged in rows and columns such that a particular memory cell may be addressed by specifying its row and column within the array. A wordline connects a row of cells to a set of sense amplifiers that detect the data in the cells. In a read operation a subset of the data in the sense amplifiers is then chosen, or "y-selected." for output. A refresh operation is similar to a read operation, but no data is output. The sensing of the data in the cells by the sense amplifiers simultaneously results in the data being rewritten to the cells. The data is thus "refreshed".

Several refresh schemes are in common use and many DRAMs include several refresh options to be chosen by the user. For example, in the RAS-only refresh mode, the timing of the refresh and the addresses of the cells to be addressed are provided from a source external to the memory circuit, from a processor or memory controller, for example. In the CAS_before RAS_(CBR) refresh mode, it is typical that during normal memory system operations the memory circuit receives refresh control inputs from a processor or other application-specific integrated circuit such as a memory controller, but the addresses of the rows to be refreshed are generated by a counter internal to the integrated circuit. The DRAM typically enters CBR refresh mode when a control input signal called the column address strobe (CAS) transitions from one logic state to another before and within a specified time period of when the row address strobe (RAS) is taken from one logic state to another. Thus, the timing of the refresh is governed by external inputs (through RAS and CAS), but the addressing operations are governed by an on-chip counter. In CBR and RAS-only refresh modes, refresh is usually accomplished by sequentially accessing all of the rows in the array. As mentioned above, by simply accessing the rows, the data contained in the rows of cells is refreshed. In the process of detecting a datum in a cell, that datum is written back into the cell at the rail voltages, typically 0 Volts and 3.3 Volts.

In periods such as a system standby or "sleep" mode when CAS_, RAS_, and other control signals from a processor or memory controller are inactive, DRAMs are often designed to revert to a self-refresh mode in which the refresh operations are controlled by the DRAM itself without external control inputs. Such a self-refresh mode is described in U.S. Pat. No. 5,365,487 issued to Patel, Brown, and Tso. This mode allows a computer system user, for example, to avoid storing data to disk and turning off the computer to save power. The self-refresh mode of the memory circuit is designed to consume as little refresh power as possible.

The foregoing has been addressed to DRAMs in general. Note also that synchronous DRAMs have analogous refresh modes to those described above. The mode analogous to the RAS-only refresh mode of a DRAM is an Activate-Deactivate cycle (ACT-DEAC/DCAB). DEAC deactivates or precharges a specified bank depending upon the Bank-select address during DEAC-command entry, while DCAB deactivates all of the banks and is typically implemented with a DEAC command along with a particular address pin being held high. The CBR-refresh analogy in synchronous memories is called Auto-refresh. Both the auto-refresh and self-refresh modes in an SDRAM are implemented with specific commands rather than with the usual CAS-before-RAS sequence used in an asynchronous DRAM.

In the traditional CBR refresh, all of the rows within the memory array (4096 rows are typical in 16 Mb and 64 Mb devices) are accessed sequentially within the refresh period specified by the manufacturer. The normal memory operations of read and write are accomplished during rest periods in refresh operations. Thus, the CBR refresh mode, which relies on external control signals for the timing of the refresh, is typically used when the DRAM is likely to be accessed by a processor or memory controller, for example. In contrast, in the sleep mode of a computer system for example, no external control inputs are provided by a processor or memory controller, so the DRAM is free to allocate the refresh cycles within the refresh period to maximize efficiency, power management, and so forth. It is common for twice as many rows or wordlines to be refreshed at a time during self-refresh mode, thus halving the number of cycles or row accesses required to refresh the entire array. For example, the complete array may be refreshed in only 2048 cycles, rather than the 4096 required to refresh the rows one at a time.

A typical 64 megabit DRAM, for example, may require addressing all wordlines at 4096 addresses every 64 ms in CBR mode. The average time between each refresh address. therefore, is about 16 $\mu$s. The same DRAM may alternatively refresh itself by an internal counter designed to refresh twice as many wordlines each cycle at only 2048 addresses. The internal counter operates at a lower frequency than CBR mode refresh to conserve power, but it must refresh all wordlines in 160 ms to avoid data loss. Thus, an average self-refresh cycle time is 80 $\mu$s. A problem arises at low counter frequencies during a transition from self-refresh mode to CBR refresh mode. When the DRAM exits self-refresh mode, two wordlines are due to be refreshed within 80 $\mu$s. Normal CBR refresh, however, would require 2048 of 4096 refresh cycles or 32 ms to refresh both wordlines. This greatly exceeds the 80 us refresh requirement for one of the wordlines. Increasing the self-refresh counter frequency would provide more time to refresh both wordlines, but this would increase power consumption. Alternatively, a requirement to increase the CBR refresh frequency upon self-refresh exit would impose an additional burden on the memory system.

SUMMARY OF THE INVENTION

In accordance with a preferred embodiment of the invention, there is disclosed a counter for generating a series of binary addresses, each of the addresses including a set of one or more most-significant bits. The counter includes circuitry to generate the addresses, including the set of most-significant bits, in a first mode and circuitry to generate the addresses, excluding the set of most significant bits, in a second mode. The counter is operable to transition between the first and second modes. The counter also includes circuitry to generate the addresses in the first mode in a non-binary count order in which the set of most-significant address bits is a set of least-significant bits in the count order. In further embodiments the counter includes circuitry to prevent the counter from incrementing during a transition from the first mode to the second mode and during a transition from the second mode to the first mode. The counter may further include circuitry to make the set of least-significant bits in the count order a predetermined state during a transition from the second mode to the first mode.

An advantage of the inventive concepts is that the refresh counter is able to switch between CBR refresh mode and self-refresh mode without skipping the refresh of rows of cells after the mode transition. The refresh operation is thus carried out in a more efficient and timely manner with a high degree of cell charge storage margin.

BRIEF DESCRIPTION OF THE DRAWINGS

The foregoing features of the present invention may be more fully understood from the following detailed description, read in conjunction with the accompanying drawings, wherein: FIG. 1 is a diagram showing memory cell locations at the intersection of wordlines and bitlines in a memory cell array;

FIG. 2a is a diagram of a three-bit counter;

FIG. 2b shows a binary count order for the addresses of eight wordlines;

FIG. 2c shows a non-binary count order in accordance with a first embodiment of the invention for the addresses of eight wordlines;

FIG. 3a is a block diagram of a DRAM integrated circuit having a memory cell array arranged in two banks;

FIG. 3b is a block diagram of a DRAM integrated circuit having a memory cell array arranged in four banks;

DETAILED DESCRIPTION OF PREFERRED EMBODIMENTS

Figure 4:
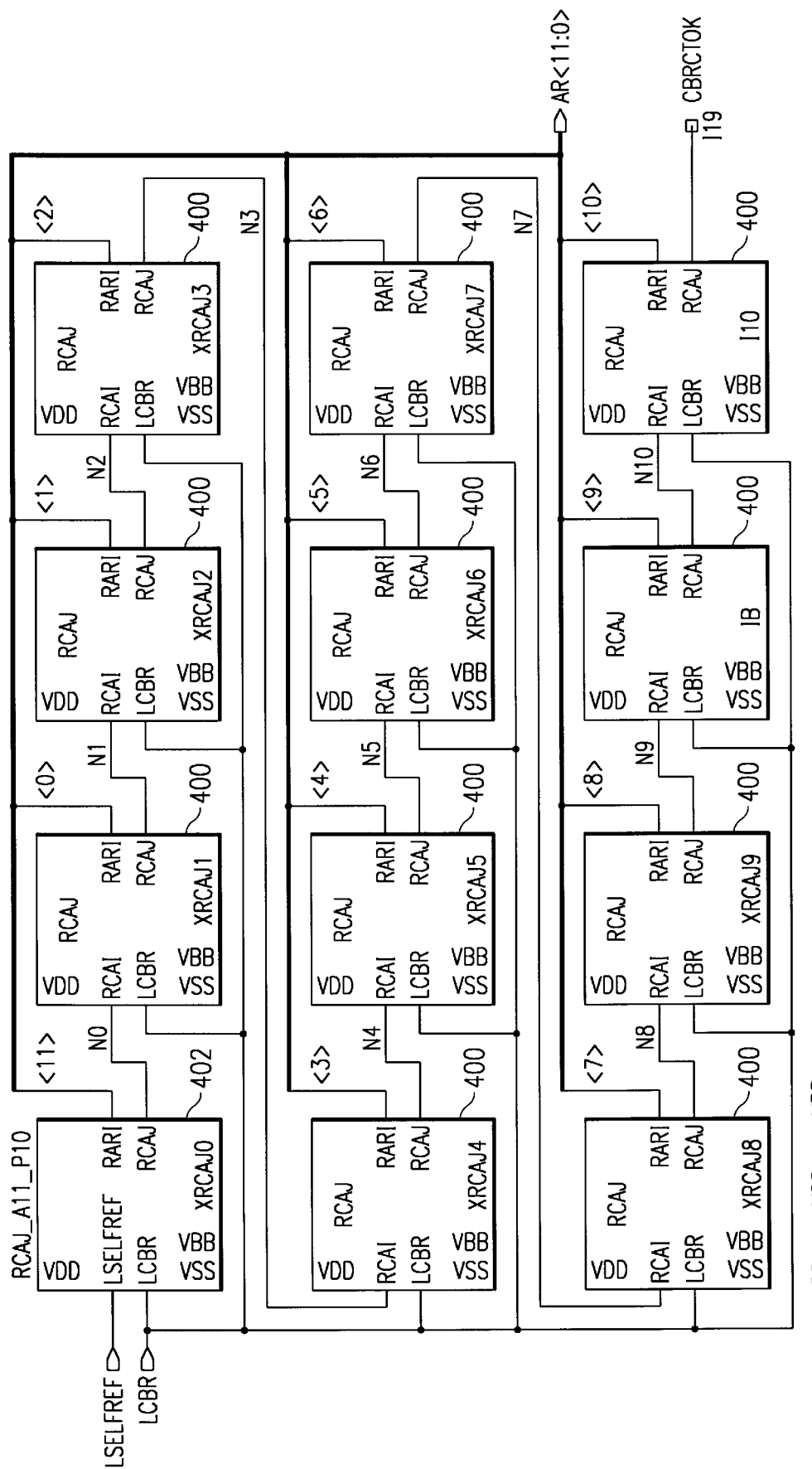
FIG. 4 is a block diagram of a counter in accordance with a second embodiment of the invention.

Referring now to FIG. 1, there is a representation of a memory array having eight wordlines (WL0–WL7) for eight rows of memory cells. In this example, CBR refresh is an eight-cycle refresh mode, while self-refresh is a four-cycle refresh mode, because two wordlines are activated simultaneously in self-refresh mode. In CBR refresh, a three-bit address counter would be used to generate the row addresses sequentially using all three counter bits. Accordingly, eight refresh cycles would be needed to refresh the cells for all eight wordlines. In contrast, in self-refresh mode the most significant bit of the counter is ignored, meaning that two wordlines are activated simultaneously, such as (WL0, WL4), (WL1, WL5), (WL2, WL6), (WL3, WL7). In this case only four refresh cycles are needed to refresh the cells for all eight wordlines.

In a situation in which the self-refresh count is interrupted and the CBR count is initiated, an anomalous condition in the count can result in some rows of cells not being refreshed prior to data loss. For example, assume that the refresh of the cells coupled to wordlines WL3 and WL7 has just been completed in self-refresh mode and the memory controller or processor has provided the signals necessary to switch to CBR refresh mode. Since WL3 and WL7 were just refreshed, the refresh of WL0 and WL4 is due in the next cycle. However, once the counter is in CBR mode, both WL0 and WL4 cannot be refreshed simultaneously, so if WL0 is the next wordline activated, four refresh cycles are performed before WL4 is finally refreshed. WL4 is refreshed after a much longer pause compared to the other rows. In other words, WL4 becomes the performance bottleneck because the charge stored in the cells controlled by WL4 must be retained much longer than that in the cells controlled by the other wordlines.

A solution to this problem is to design a counter that is compatible with two different refresh cycle rates. In one embodiment of the invention and referring to the simple eight wordline case described above, the counter generates the addresses of WL0 and WL4 in consecutive cycles so that they are refreshed one after the other when the refresh mode is switched from self-refresh to CBR refresh. Thus, WL4 is refreshed in the second cycle after the transition instead of in the fifth cycle as would be the case in the example described above. The importance of this improvement may be better understood when one remembers that instead of eight wordlines, memory circuits typically have several thousands of wordlines, and what is an improvement of three refresh cycles in the simple example above may in reality be an improvement of several thousand cycles. Any margin that may be gained on the refresh period required of existing devices is valuable, but improvement in refresh period could also allow for the use of memory storage cells with more leakage and shorter storage times, a factor that may become important as memory integrated circuits are designed to do more and occupy less space.

FIG. 2a is a block diagram of a three-bit binary counter with counter stages $X_0$, $X_1$, and $X_2$, $A_2$, $A_1$, and $A_0$ are the address bits, while $C_0$ and $C_1$ are carry bits. FIG. 2b is a simple address binary counting scheme produced by the circuit of FIG. 2a for the eight wordline example described above. The addresses for each of the wordlines WL0 through WE7 are shown. $A_2$ is the most significant bit in the address and $A_0$ is the least significant bit. The progression of addresses shown in FIG. 2b is the counting order that might be found in a conventional CBR counting scheme. The self-refresh scheme of activating two wordlines simultaneously is typically achieved by simply ignoring part of the address, in particular the most significant bit, $A_2$. One can see that if the $A_2$ bit is ignored, two addresses match each of the possible combinations of $A_1$ and $A_0$ (WL0 and WL4 each have zero values for address bits $A_1$ and $A_0$, for example). Thus, the same counter is used for both refresh schemes, but part of the address is ignored in self-refresh mode to allow for the activation of twice as many row addresses. As previously described, transitioning from the self-refresh mode to the CBR refresh mode can result in wordlines remaining unrefreshed for an undesirably long period of time.

In a first preferred embodiment, a refresh counting scheme is used in which the bits of the row address that are ignored in the self-refresh mode are treated as the least significant bits in the CBR refresh counter. In other words, the address bits are rearranged as shown in FIG. 2c such that the order of counting from WL0 to WL7 is no longer a simple binary count. Indeed, the count is now in the following order: WL0, WL4, WL1, WL5, WL2, WL6, WL3, and WL7. As in the scheme described above, the $A_2$ bit is ignored when in self-refresh mode so that the pairs (WL0, WL4), (WL1, WL5), (WL2, WL6), (WL3, WL7) are activated simultaneously, but an advantage of this counting scheme is that in the transition from self-refresh mode to CBR mode, the paired wordline is activated consecutively with its neighbor. In other words, if the (WL0, WL4) pair were due to be refreshed prior to the transition to the CBR count mode, the next wordline to be activated would be WL0, followed by WL4. Thus, WL4 does not wait five cycles to be refreshed as it would in the conventional counting scheme described above.

The schemes described herein are applicable to addresses of any length. Indeed, a more generalized description of the embodiment scheme is that the self-refresh mode refresh rate is $2^i$ that of the externally-prompted CBR refresh mode. While in CBR mode the counter in the memory integrated circuit behaves as an n-bit counter, while in self-refresh mode the counter behaves as an (n-i) bit counter. The variable n represents the total bits in the counter when the circuit is in CBR mode, while the variable i represents the total bits that are ignored while in self-refresh. For example, in the simple eight wordline case described above, n is 3 and i is 1. Actual memory integrated circuits of course use addresses with many more bits. For example, a 64 Mb DRAM might use address bits A0 through A13. Of those fourteen address bits, some are typically dedicated to bank selection (in multiple-bank memory arrays). For example in a four-bank memory array, bits A12 and A13 typically are used for bank selection. These bits are ignored for refresh address counting, meaning that n is 12 in this case. The refresh counter, therefore, provides 12 address bits to a row decode circuit 1212 and 1210 (FIG. 12) for wordline selection.

The variable i is still 1 if two wordlines are to be activated simultaneously in self-refresh mode. So, a 64 Mb DRAM typically uses a twelve bit counter for the 4096 address CBR refresh mode and an eleven bit counter for the 2048 address self-refresh mode. The address A11 is ignored in self-refresh mode, and while A11 is the most significant bit of the address provided to the row decode circuit for wordline selection, it is the least significant bit of the counter.

A further feature of the embodiment scheme is that steps are taken to ensure that the (n-i) stages that are involved in both the CBR and self-refresh modes do not change during the transition to or from the self-refresh mode. For example, the $A_0$ and $A_1$ bits in the eight-wordline example described above are prevented from changing during the transition to or from self-refresh mode. As an illustration of the importance of keeping the address bits static during the transition consider the case where the self-refresh mode is to be entered with the address bit states $A_2$=0, $A_0$=0, $A_1$=1, which means that the (WL2, WL6) pair corresponding to $A_2$=don't care, $A_0$=0, and $A_1$=1 is to be refreshed immediately. Assume that $A_0$ toggles from 0 to 1 during the transition, meaning that the (WL3, WL7) pair corresponding to $A_2$=don't care, $A_0$=1, $A_1$=1 is refreshed instead of the (WL2, WL6) pair that was due for refresh. As a consequence of the toggling of the bit during the transition to self-refresh mode, either WL2 or WL6 could suffer pause-related data loss.

In another example, consider the case where the counter is to go from self-refresh mode to CBR mode with the address bit states $A_0$=1, $A_1$=0, which means that WL1 and WL5 are to be refreshed in the first two CBR refresh cycles following the transition. Assume that $A_1$ toggles from 0 to 1 during the transition from self-refresh mode to CBR mode. The toggling of $A_1$ results in wordlines WL3 and WL7 being refreshed rather than WL1 and WL5. Thus, WL1 and WL5, which were due to be refreshed and hence most in danger of suffering data loss, are skipped because of the toggling of $A_1$. The chances of pause-related data loss are therefore much greater.

In another feature of the preferred embodiment, all of the i bits, that is the bits that are ignored while in self-refresh mode, are set to a predetermined state (zero for example) at some point prior to the transition to CBR mode. Thus, in the simple example described above, the $A_2$ address bit is set to 0 before the counter transitions to the CBR counting mode. As an illustration of the advantage of this approach, consider the following example. Assume the counter is to transition from self-refresh to CBR refresh with the address bit states $A_0$=1 and $A_1$=1, meaning that WL3 and WL7 are awaiting refresh and should be refreshed as soon as possible after the transition. Assume also that $A_2$=1 during the transition, so that after the transition, WL7 is refreshed first. This result is acceptable with regard to WL7 because it was due to be refreshed. WL3, however, will not be the next address refreshed because the counter is in CBR mode and will advance from WL7 to WL0. The chances of WL3 encountering a pause-related failure are therefore much greater. This result could be avoided by ensuring that the ignored bit, $A_2$, is 0 when the counter begins it CBR mode. Thus, in the example described above, the counter will first refresh WL3 ($A_2$=0, $A_0$=1, $A_1$=1) on the first CBR cycle and WL7 ($A_2$=1, $A_0$=1, $A_1$=1) on the second cycle.

A second preferred embodiment of the invention is described below as an implementation of a 64 Mb synchronous DRAM integrated circuit having a 16 bit output. The concepts described herein are of course applicable to other memory sizes and output widths. The DRAM may be arranged with the memory array divided into two or four banks. FIG. 3a is a block diagram of the two bank configuration and FIG. 3b is a block diagram of the four bank configuration. The refresh of the array banks 300 is controlled by refresh circuitry in the control blocks 302. The external inputs used to prompt the device to enter CBR mode are provided on the RAS_ and CAS_ lines 304. Fourteen address inputs (A0–A13) are shown, but A12 and A13 are used as bank selects. The DRAM can be arranged to have output widths of 16, 8, and 4 bits as shown.

FIG. 4 is a block diagram of a refresh counter that may be used in the DRAM of FIG. 3. FIG. 4 includes twelve counter stages: eleven stages labeled RCAJ (blocks 400) and one special stage for the twelfth and most significant address bit labeled RCAJ__A11__P10 (block 402). Note that in a situation where more than two wordlines are to be activated simultaneously in self-refresh mode, more than one of the special RCAJ__A__P10-type stages could be used. For example, if I=2, four wordlines are activated in each refresh cycle and two stages like RCAJ__A11__P10 serve as the least-two significant stages of the counter.

Figure 5:
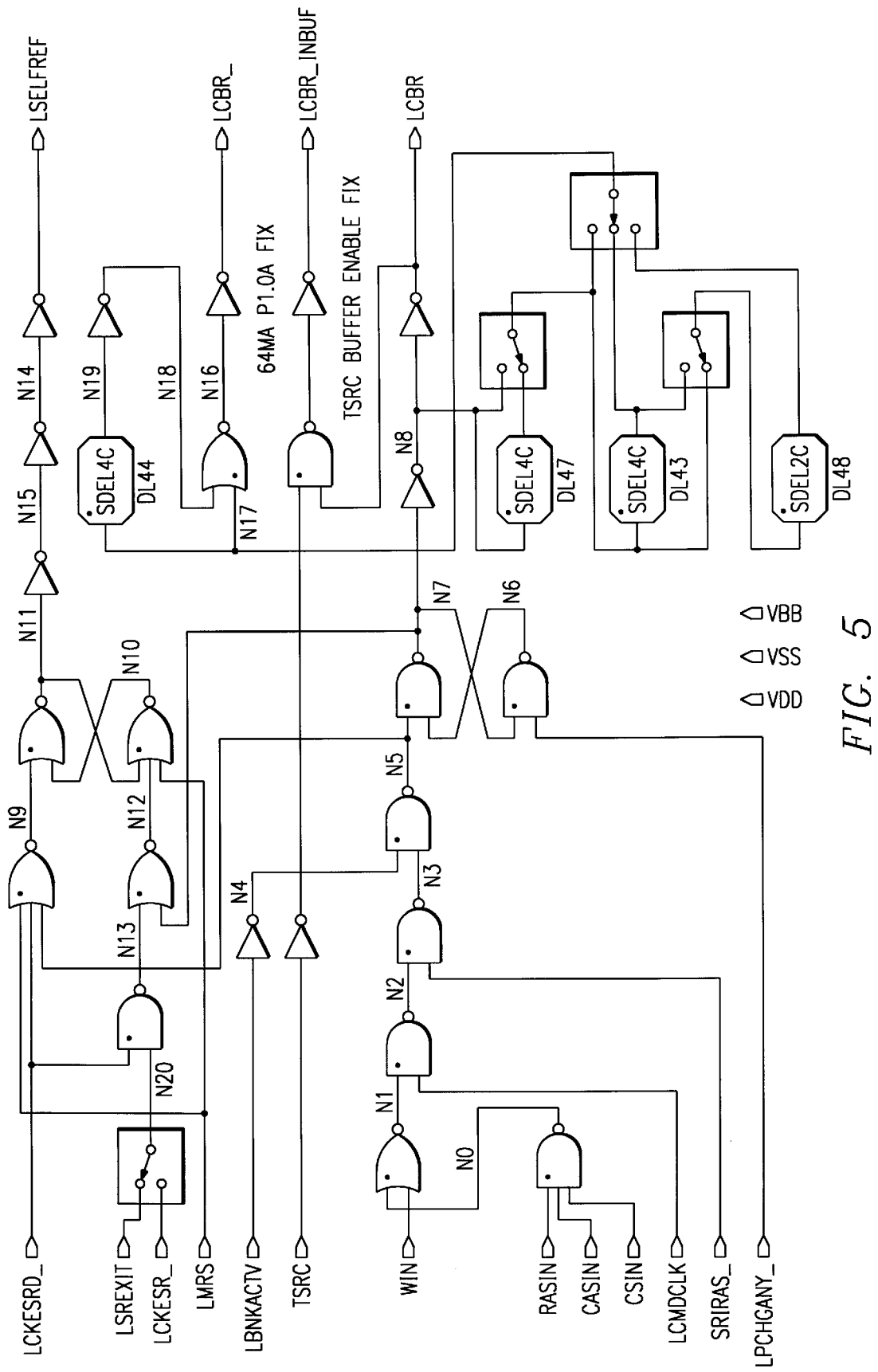
FIG. 5 is a schematic diagram of a circuit used to generate signals to control the counter of FIG. 4.
Figure 6:
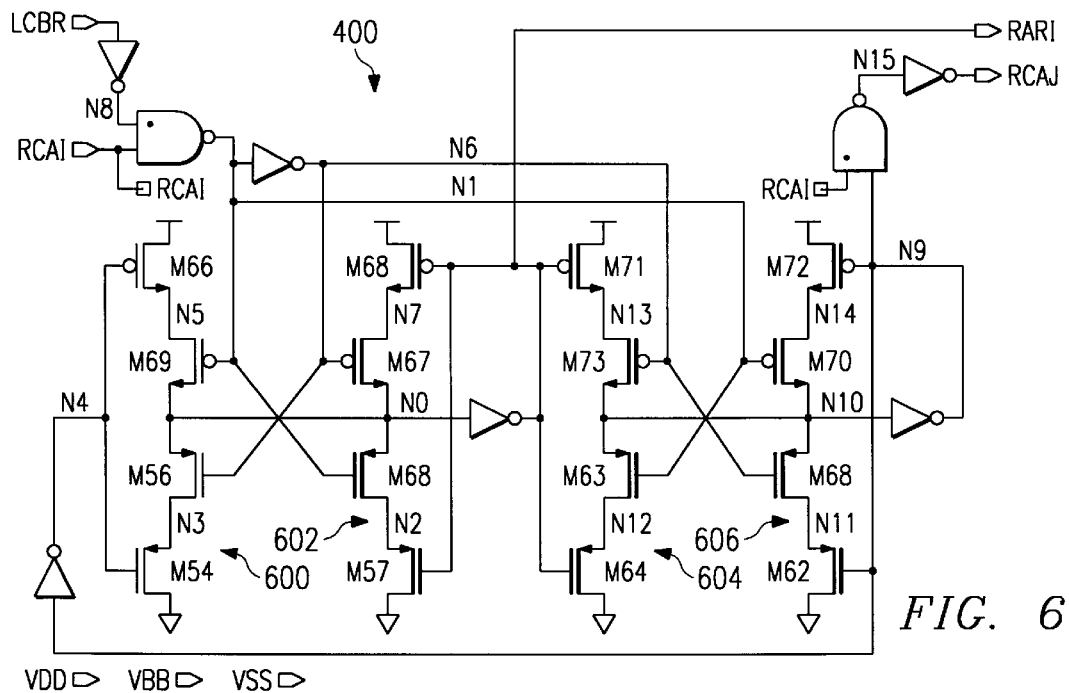
FIGS. 6 and 7 are schematic diagrams of counter stages included in the counter of FIG. 4.
Figure 7:
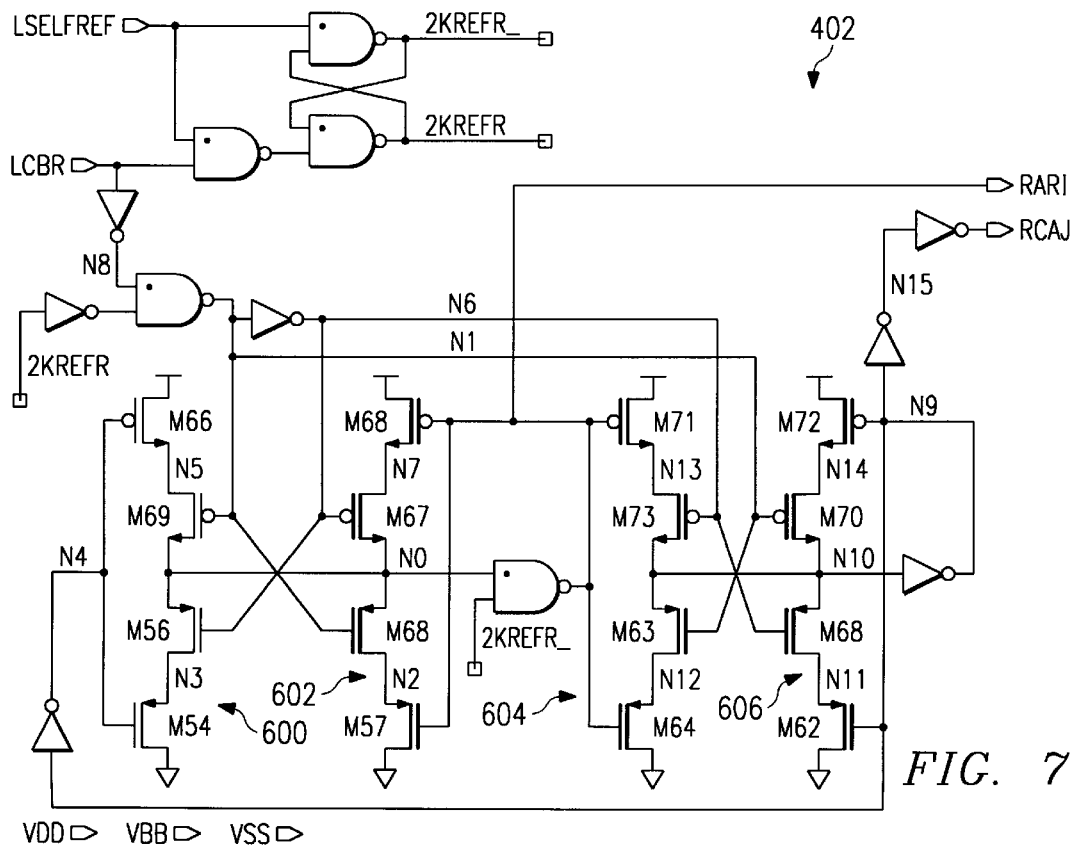

Each of the counter stages has an address-out signal, RARI, a carry-in signal, RCAI, and a carry-out signal, RCAI. The LCBR is a controlling input signal derived from RAS and CAS inputs, among other control signals, in the circuit shown in FIG. 5. CBR-refresh (auto-refresh) and self-refresh are prompted by commands issued to a synchronous DRAM. The circuit in FIG. 5 that produces LCBR decodes external inputs and generates LCBR and LSELF-REF as appropriate. In this embodiment, the CBR-refresh or auto-refresh command is issued if at the rising edge of the system clock signal, the following conditions are satisfied: CKE was high at the previous clock cycle, or the memory circuit has exited from clock-suspend, power-down, or self-refresh; all banks are deactivated; chip-select (CS__) is low; RAS__is low; CAS__is low; and write (W__) is high. The address bits are don't care values for this command. The command conditions for self-refresh are the following: CKE was high at the previous dock cycle and is brought low at the command-issuing cycle; all banks are deactivated; CS__is low; RAS__is low; CAS__is low; and W__is high. The address bits are also don't care values for this command. The RCAJ blocks 400 are shown in schematic detail in FIG. 6 and the RCAJ__A11__P10 block 402 is shown in schematic detail in FIG. 7.

As described above, a feature of the embodiment circuits is that the (n-i) portion of the counter bits do not change when the counter transitions from CBR mode to self-refresh mode, or vice versa. The implementation of this feature in the second preferred embodiment is as follows. The counter stages 400 and 402 are designed to "count up" when LCBR makes a transition from a high logic level to a low logic level; that is, RARI is incremented on high-to-low transitions of LCBR. The counters, however, "carry up" when LCBR makes a transition from a low logic level to a high logic level. This may be better understood by reference to the following description of counter operation.

The core of each of the counter stages 400 and 402 comprises four tristateable inverters (600, 602, 604, and 606), of which only two are active simultaneously. The first inverter 600 and the fourth inverter 606 can be active when the voltage at N1 is a logic low and when the voltage at N6 is a logic high. The second inverter 602 and third inverter 604 can be active when the voltage at N1 is a logic high and the voltage at N6 is a logic low. Only one of the two sets, (600 and 606) or (602 and 604), are active at a given time. A particular address state is held at RARI as long as N6 is a logic-low voltage and N1 is a logic-high voltage, meaning that inverters 602 and 604 are active while inverters 600 and 606 are inactive. The logical state at N4 is the complement of RARI and is held as long as N1 is a logic high and N6 is a logic low. The counter stages 400 and 402 count up (toggle) if the corresponding carry-in (RCAI) is a logic high and the control signal LCBR transitions from a logic high to a logic low. This causes N1 to go to a logic low and N6 to go to a logic high voltage, and as a result, inverters 602 and 604 become inactive and inverters 600 and 606 become active. With the activation of inverter 600, the complementary address state being held at N4 passes on to RARI. This, therefore, is an illustration of how the counting-up operation is based on a high-to-low transition of LCBR.

Even though the address in the above description counted up, the corresponding carry-out bit, RCAJ, is not generated because with N1 a logic low and N6 a logic high, inverters 602 and 604 are inactive. With inverter 604 inactive, the path from RARI to RCAJ is cut off. A new carry-out signal RCAJ relies on a LCBR transition from low-to-high, so that N6 goes to a logic low and N1 goes to a logic high. This activates inverters 602 and 604 to generate the new carry-out signal. In short, the counter stages count up on a high-to-low transition of LCBR, and carry-up on a low-to-high transition of LCBR.

Once a particular counter stage has counted up in response to an LCBR high-to-low transition, it does not count up further without an intervening LCBR low-to-high transition. Self-refresh mode is entered on a LCBR low-to-high transition and is exited after a LCBR high-to-low transition. Thus, at entry to the self-refresh mode the address counter does not count up since counting up is done at a high-to-low transition. When exiting self-refresh mode, the counter does not count up because it completed a count-up operation when LCBR made a transition from high-to-low. Indeed, the counter must await an intervening low-to-high transition before it may count up again.

Another feature of the embodiment circuits is that the i bits in the counter are set to zero prior to the counter transitioning from self-refresh to CBR refresh mode. This feature is implemented in the second preferred embodiment circuit as follows. Refer first to the schematic for the RCAJ__A11__P10 counter stage shown in FIG. 7. At entry to the self-refresh mode, the signal 2KREFR__is latched to a logic high voltage and 2KREFR is latched to a logic low. This forces RARI to a logic high and RCAJ to a logic high. In self-refresh mode, 2KREFR__is a logic low and 2KREFR is a logic high. So N1 is a logic high, N6 is a logic low, and N4 is a logic low. At self-refresh mode exit, both LSELF-REF and LCBR are logic lows, causing 2KREFR__to be latched high and 2KREFR to be latched low. N1 goes low and N6 goes high, which in turn causes N0 to go high (due to the previous state of N4 being low during self-refresh) and causes RARI, to go to a logic low, or zero, as intended.

Figure 8:
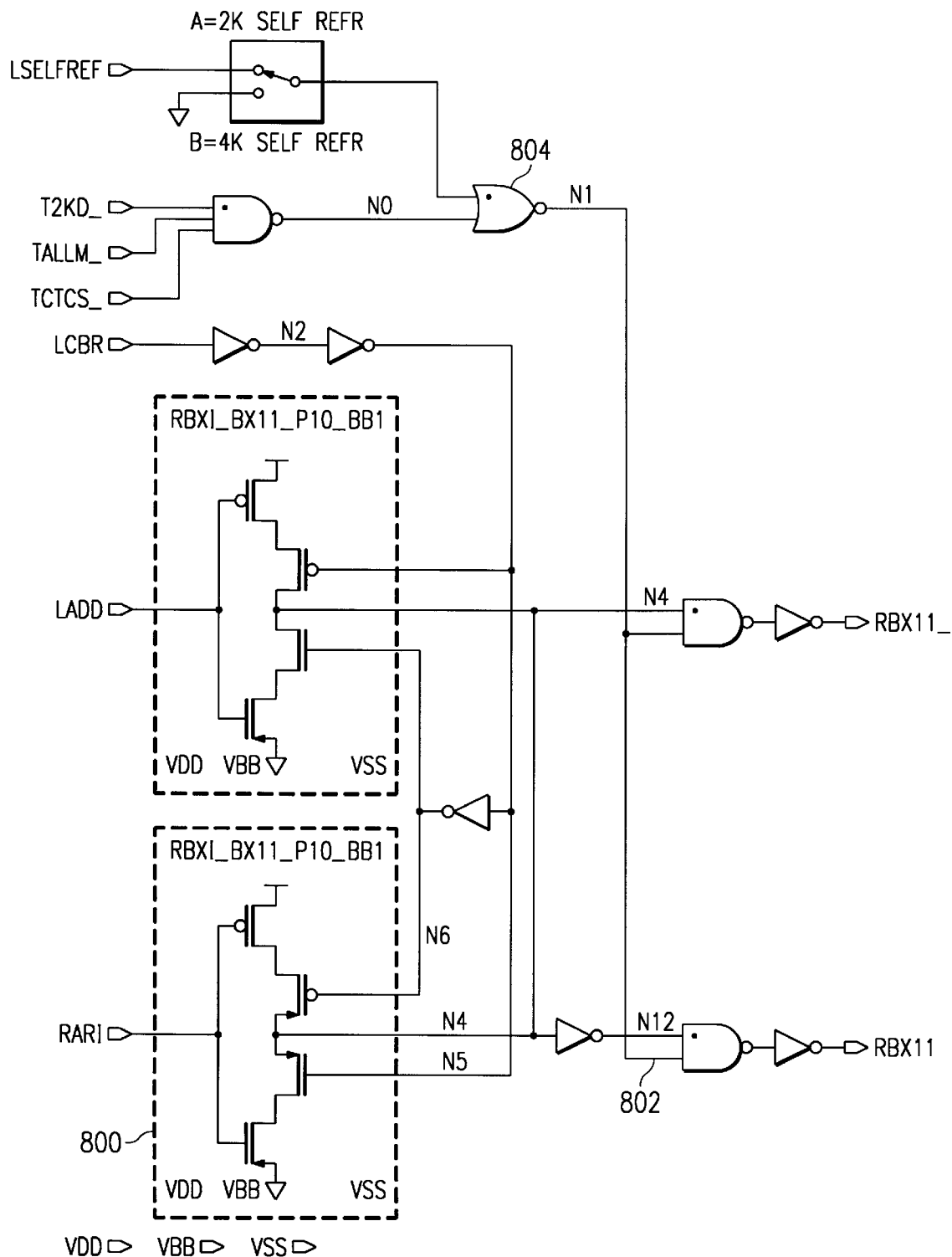
FIG. 8 is a schematic of driver circuitry for the signals generated in the circuits of FIGS. 4, 6, and 7.

The RARI signal, or counter address, for stage 402 is ignored during self-refresh. Note that in the circuit of FIG. 8 the output of address driver 800 is inconsequential in view of the logic low on line 802 that is produced by NOR gate 804 as a result of a logic high LSELFREF signal. Also note that the holding of RCAJ in stage 402 at a logic high during self-refresh mode transforms the twelve-bit counter into an eleven-bit counter.

The concepts described above may be better understood by reference to the timing diagrams of FIGS. 9, 10, and 11. FIGS. 9a through 9d show second embodiment circuit performance for four CBR cycles. FIGS. 10a through 10d show second embodiment circuit performance, including self-refresh mode entry, for four self-refresh cycles. FIGS. 11a through 11d show second embodiment circuit performance for four CBR refresh cycles following self-refresh mode exit. These waveforms are from a simulation of the circuit shown in FIG. 4. Some of the waveforms represent node voltages in the circuits shown in FIGS. 6 and 7.

Figure 9A:
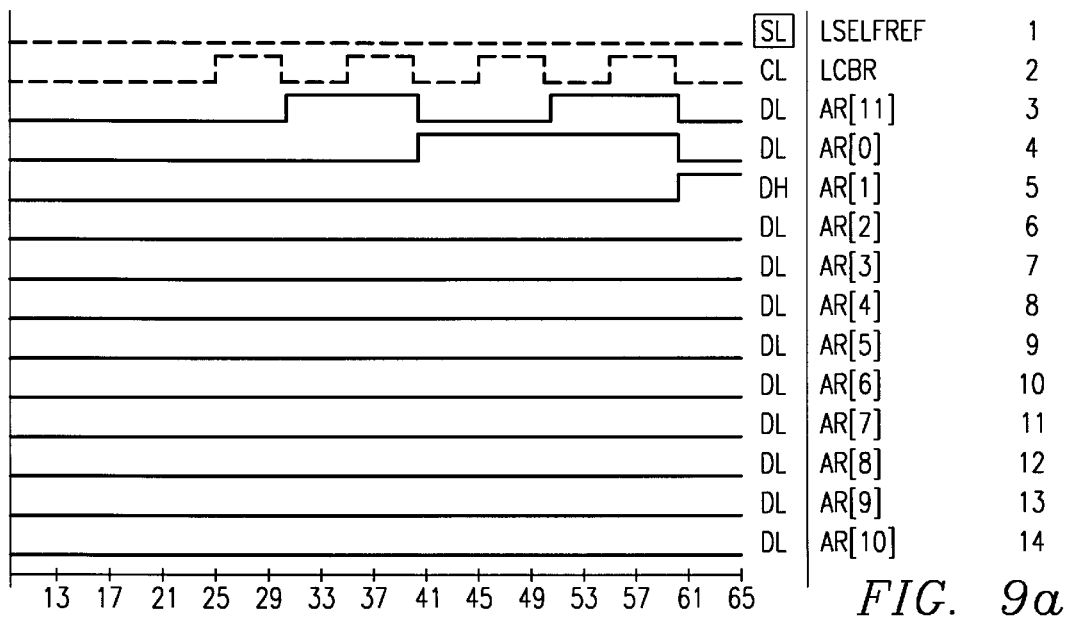
FIGS. 9a–9d show voltage waveforms for input signals, output signals, and intermediate nodes in the circuits of FIGS. 4, 6, and 7 for four CBR refresh cycles.
Figure 9B:
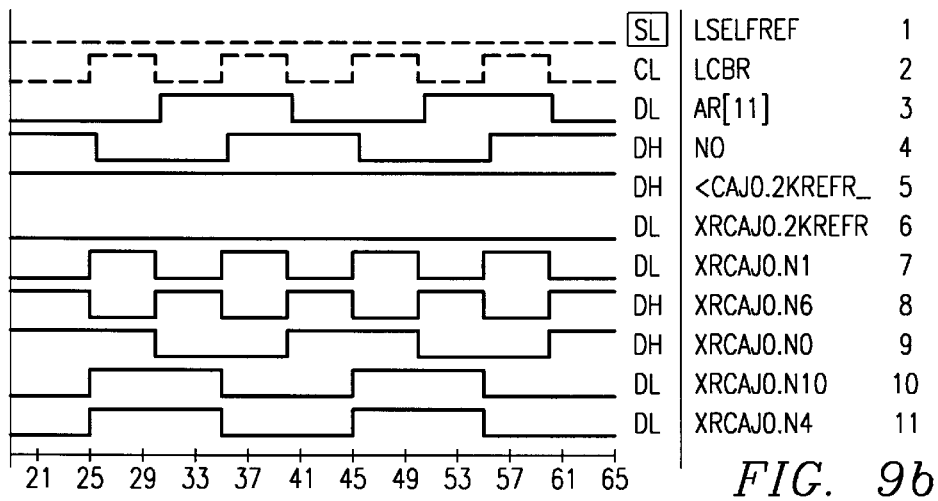
Figure 9C:
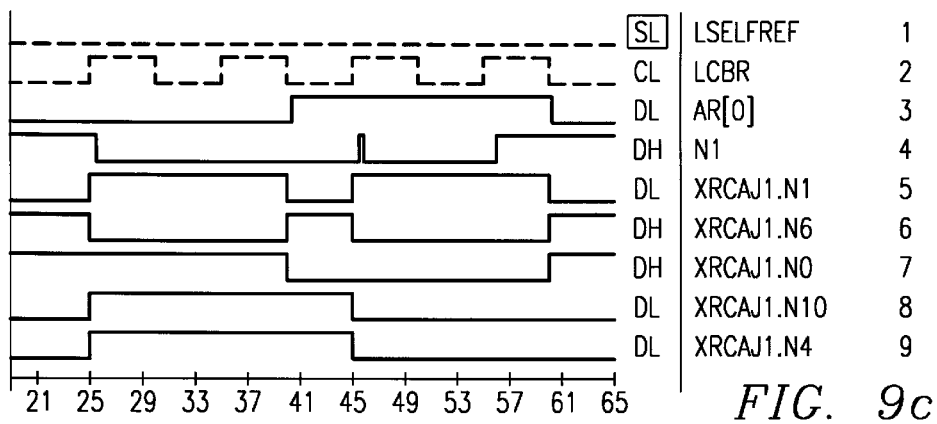
Figure 9D:
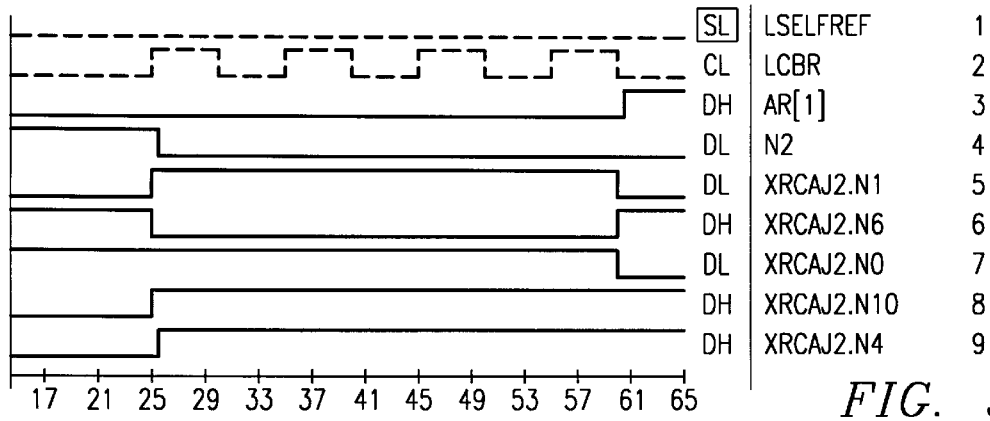

FIG. 9a shows the logic low level of LSELFREF and the toggling LCBR signal for the memory circuit in CBR refresh mode. The waveforms AR[11] through AR[10] show the state of the counter stages 402 and 400 during the four CBR cycles. FIG. 9b shows the waveforms for the carry bit N0, the 2KREFR_ and 2KREF signals, and the voltages at nodes N1, N6, N0, N10, and N4 for the least significant counter stage 402 (RCAJ0) in FIG. 4. FIG. 9c and 9d are similar to FIG. 9b, but show the waveforms for the RCAJ1 and RCAJ2 stages, respectively. The voltage waveforms for the remaining counter stages are not shown, but perform similarly to the RCAJ1 and RCAJ2 stages.

Figure 10A:
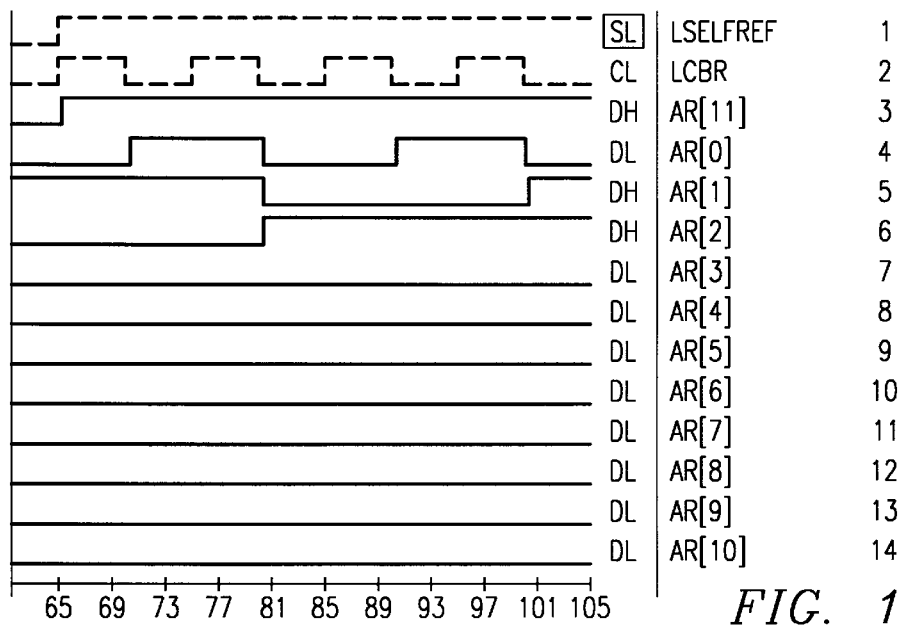
FIGS. 10a–10d show voltage waveforms for input signals, output signals, and intermediate nodes in the circuits of FIGS. 4, 6, and 7 for four self-refresh cycles.
Figure 10B:
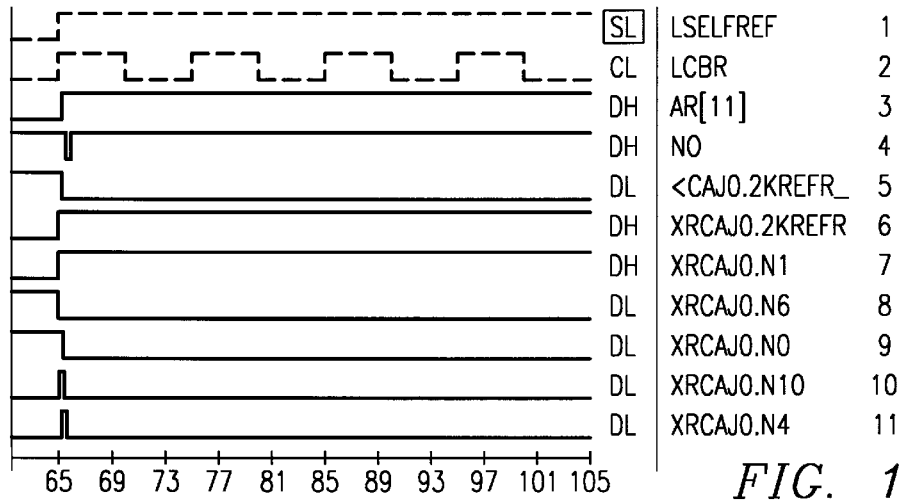
Figure 10C:
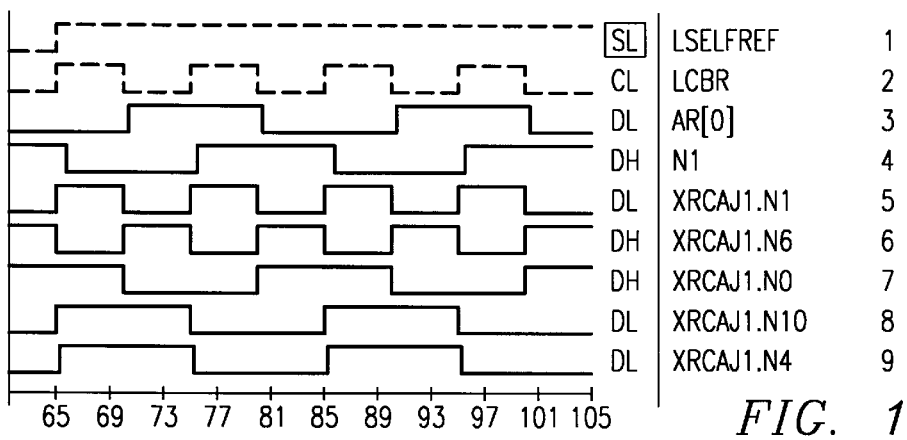
Figure 10D:
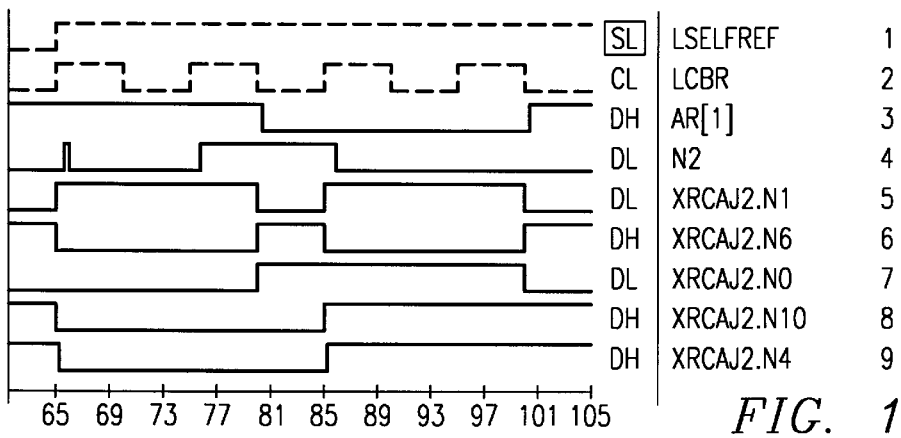

FIG. 10a shows the transition of LSELFREF to a high logic level to signal entry to self-refresh mode. Note that the voltage for AR[11] is high during self-refresh mode. FIG. 10b shows the relatively disabled state of the RCAJ0 stage during self-refresh mode. Note in FIG. 10c that the RCAJ1 stage becomes the least significant bit during self-refresh. FIG. 10d shows the waveforms for the RCAJ2 counter stage.

Figure 11A:
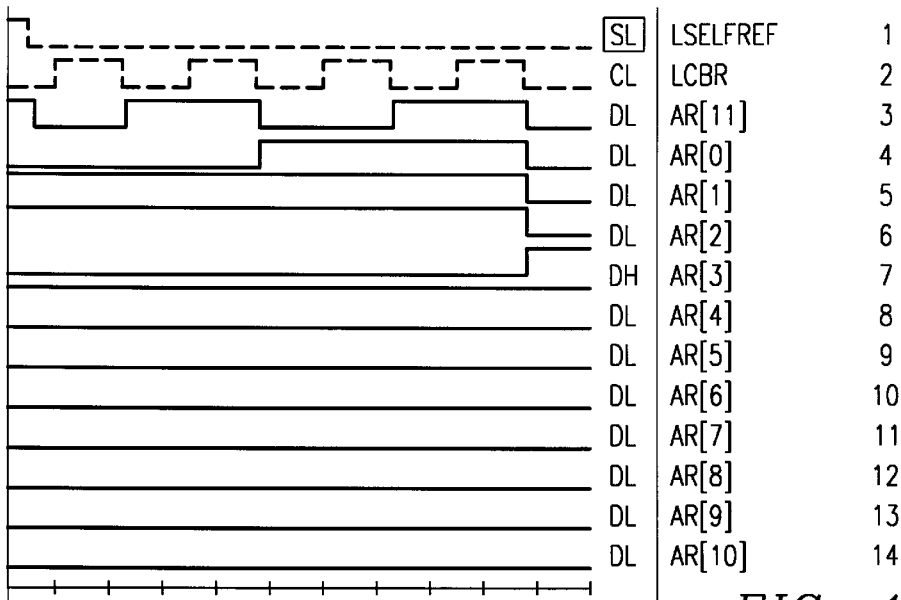
FIGS. 11a–11d show voltage waveforms for input signals, output signals, and intermediate nodes in the circuits of FIGS. 4, 6, and 7 for four post-self-refresh CBR refresh cycles.
Figure 11B:
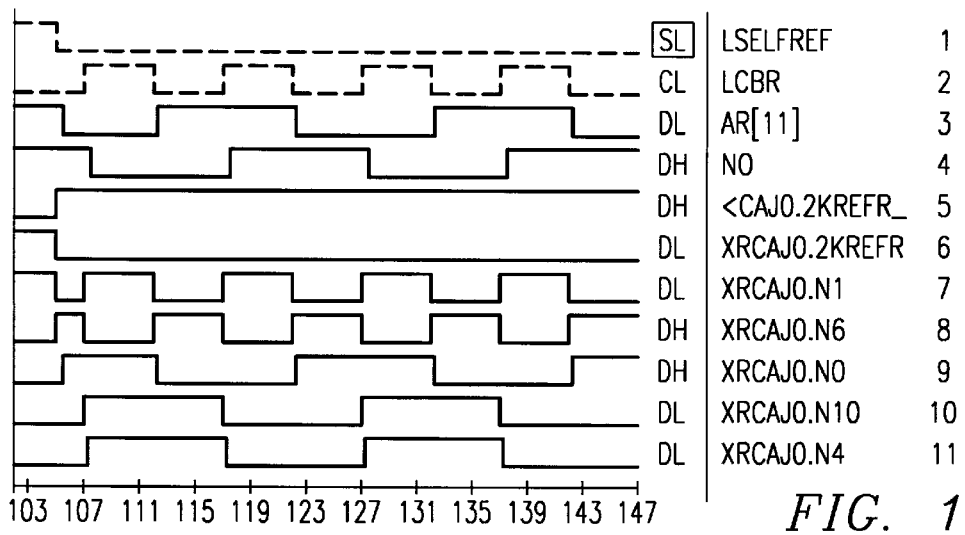
Figure 11C:
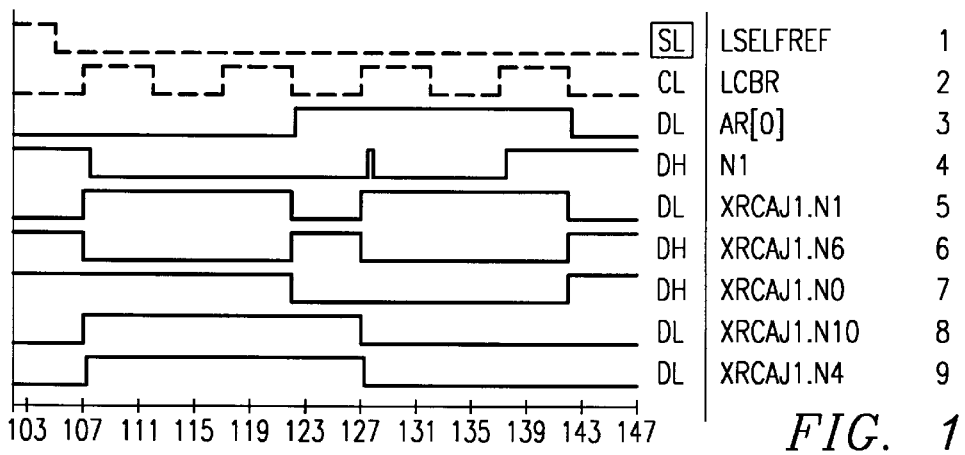
Figure 11D:
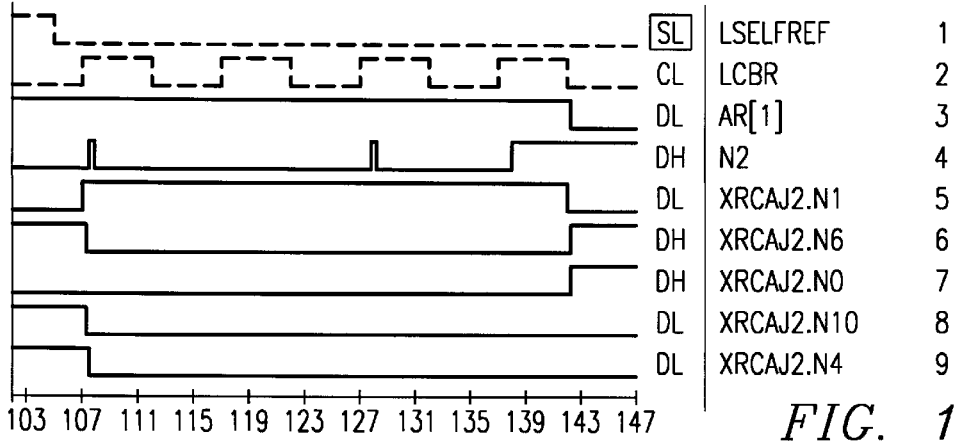

FIG. 11a shows LSELFREF transitioning from high-to-low signaling the exit from self-refresh mode back to CBR mode. In FIG. 11b, the least significant counter bit AR[11] resumes toggling with the LCBR pulses, as in FIG. 9b. The waveforms in FIGS. 11c and 11d are also similar to those of FIGS. 9c and 9d. Note that AR[11] is FIG. 11b goes low when LSELFREF goes low. Thus, the aspect of the embodiments described above in which the i-bits are set to zero at the exit of self-refresh mode and entry to CBR-refresh mode is satisfied by the second embodiment circuit.

Figure 12:
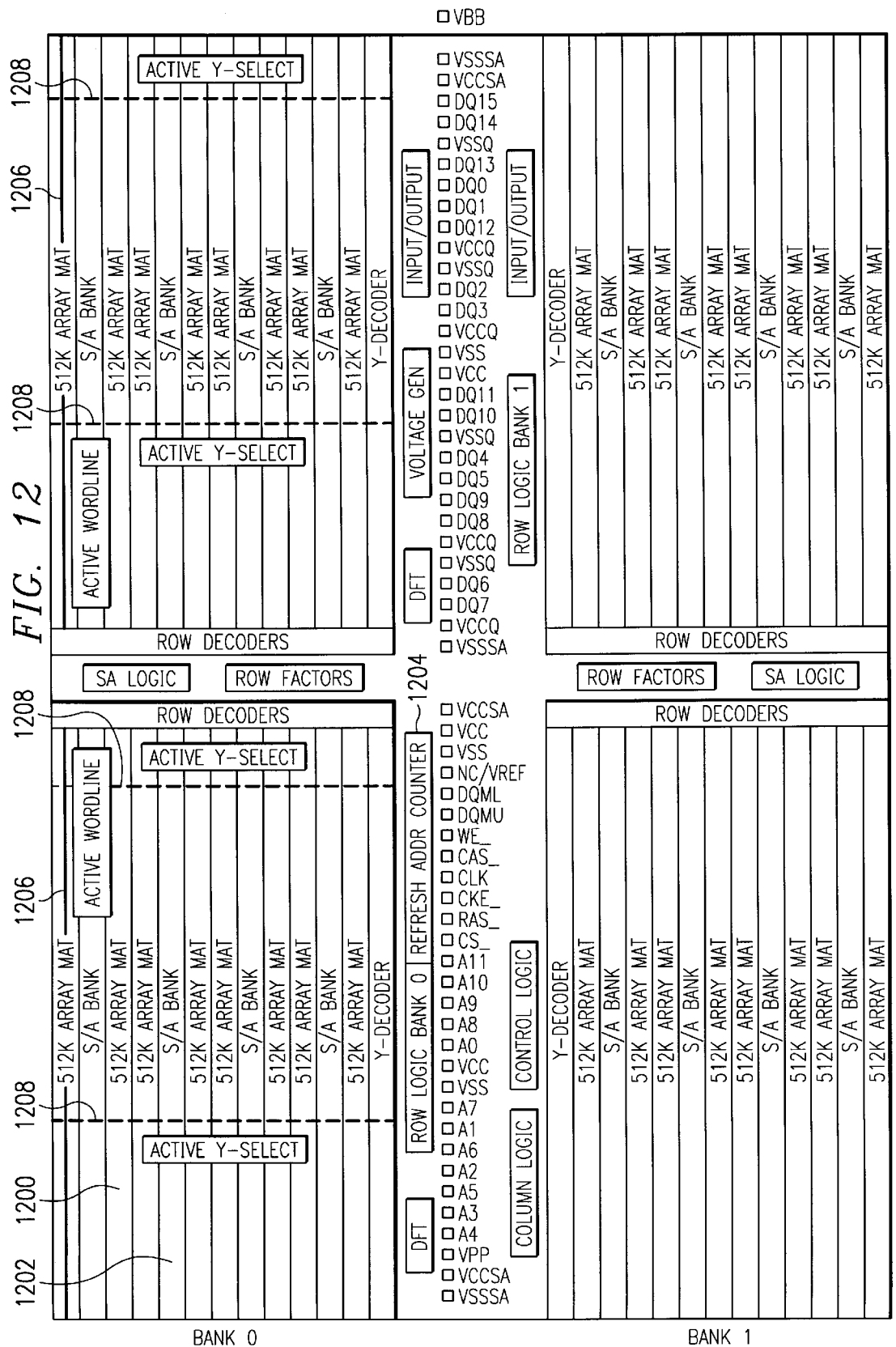
FIG. 12 is a block diagram layout of a 16 megabit DRAM integrated circuit.

A third preferred embodiment of the invention is described below as an implementation of a 16 Mb synchronous DRAM integrated circuit having a 16 bit output. The chip layout of the DRAM is shown in FIG. 12. The memory cell array is divided into two banks: Bank 0 and Bank 1. Each bank consists of two arrays, with each of these arrays divided into eight 512k subarray matrices 1200. A sense amplifier bank 1202 is shared by two of the 512k subarrays. The integrated circuit also includes refresh address counter 1204. The bold lines in FIG. 12 represent a situation in which a wordline 1206 is active in each of the arrays of Bank 0. Two y-selects 1208 in each of the arrays are shown as active. Thus, in this situation four sets of data are available for output.

Figure 13:
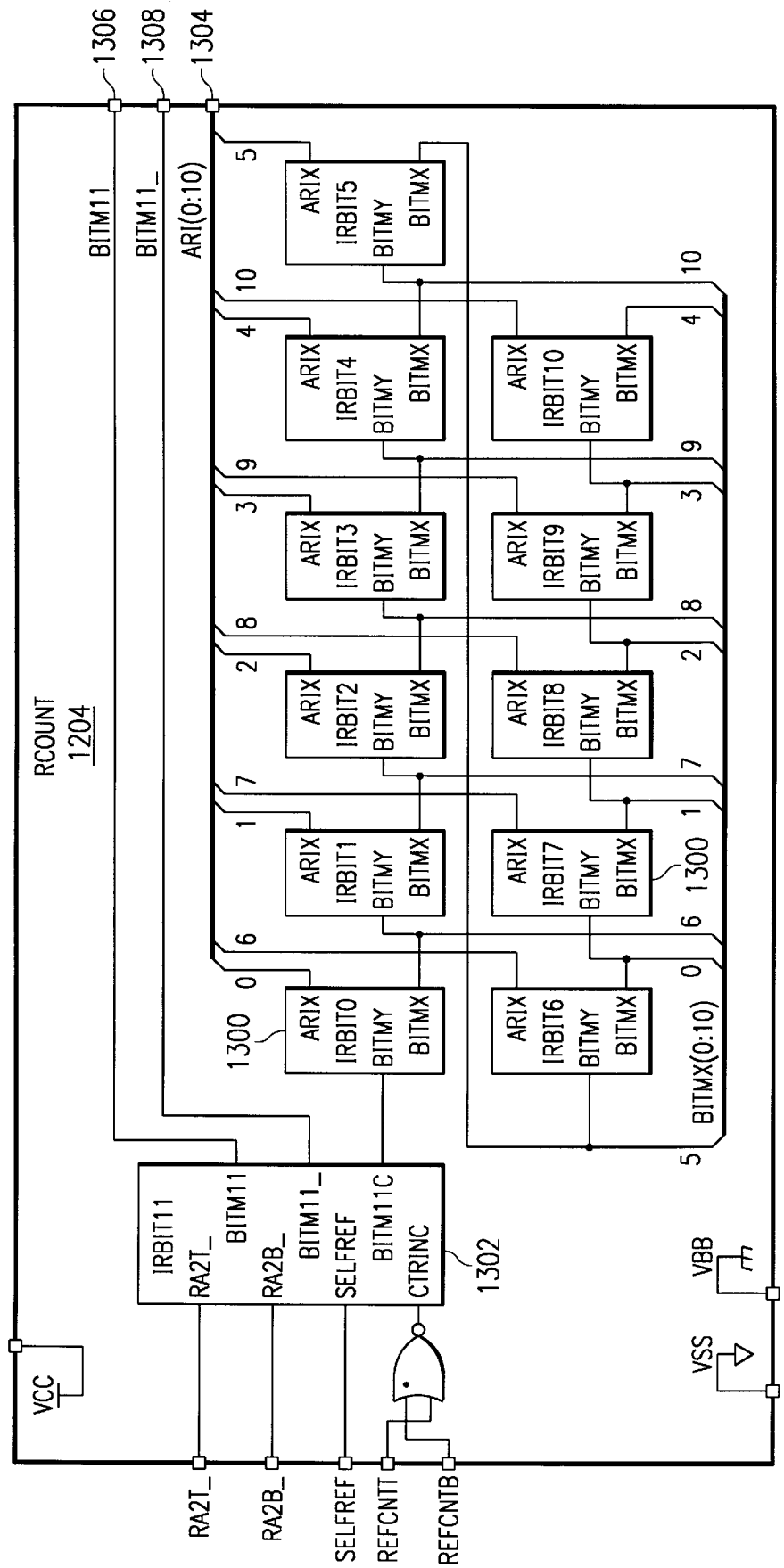
FIG. 13 is a block diagram of a counter in accordance with a third preferred embodiment of the invention.

FIG. 13 is a block diagram of refresh address counter 1204 shown in FIG. 12. The counter comprises eleven identical count stages 1300, one each for address bits A0 through A10, and a count stage 1302 for the least significant counter bit (and most significant address bit), A11. Line 1304 is the eleven bit output of the counter, while lines 1306 and 1308 carry the true output of the twelfth counter bit and its complement, respectively. Counter 1204 is a ripple counter. Each bit toggles when the carry-in bit transitions from a logic-low voltage to a logic-high voltage. The REFCNTT and REFCNTB signals indicate that the counter is to be incremented. REFCNTT is the incrementing signal for Bank 0, and REFCNTB is the incrementing signal for Bank 1. SELFREF is the signal that puts the counter into self-refresh mode in which it ignores the highest order address bit, A11.

Figure 14:
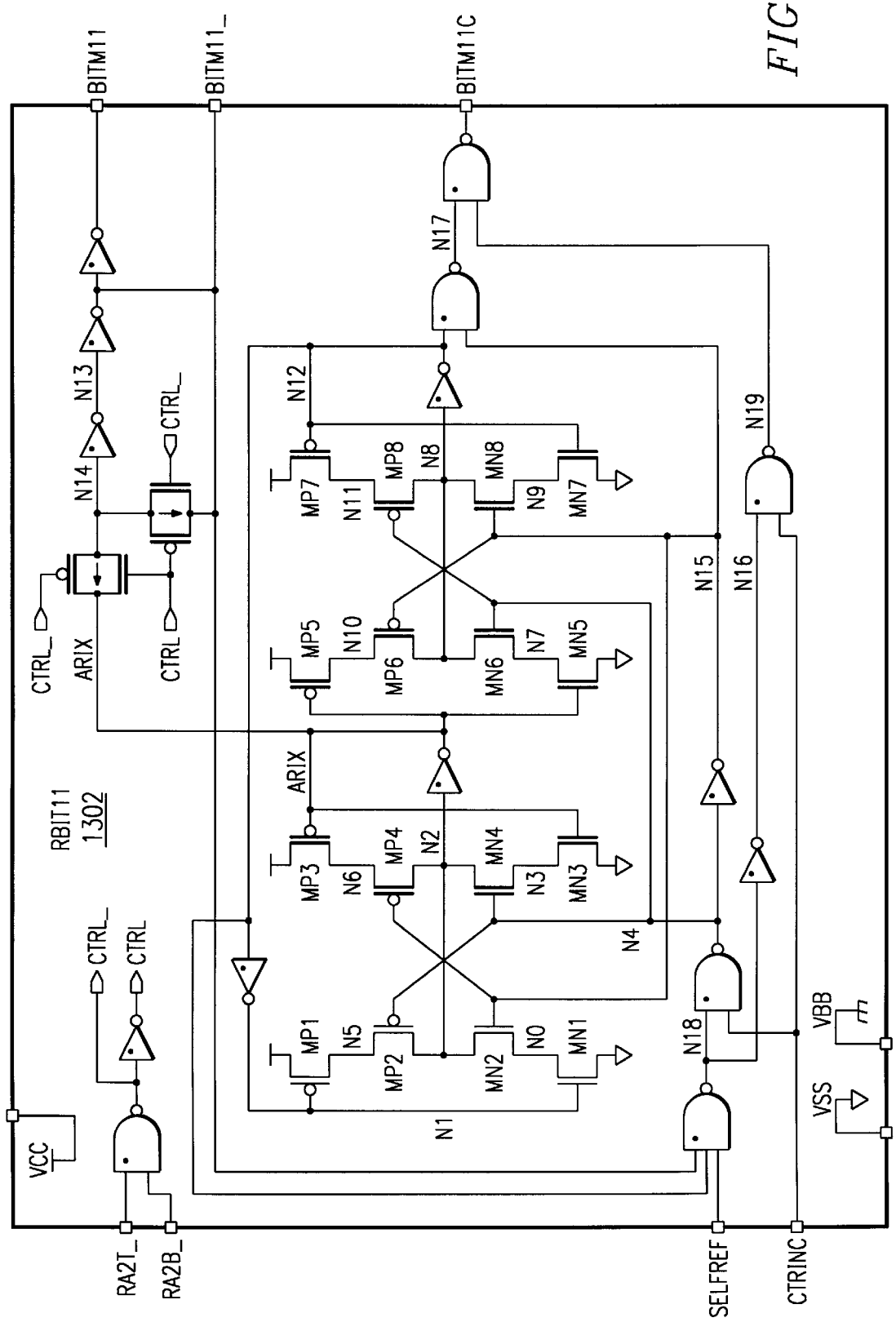
FIGS. 14 and 15 are schematic diagrams of counter stages included in the counter of FIG. 13.
Figure 15:
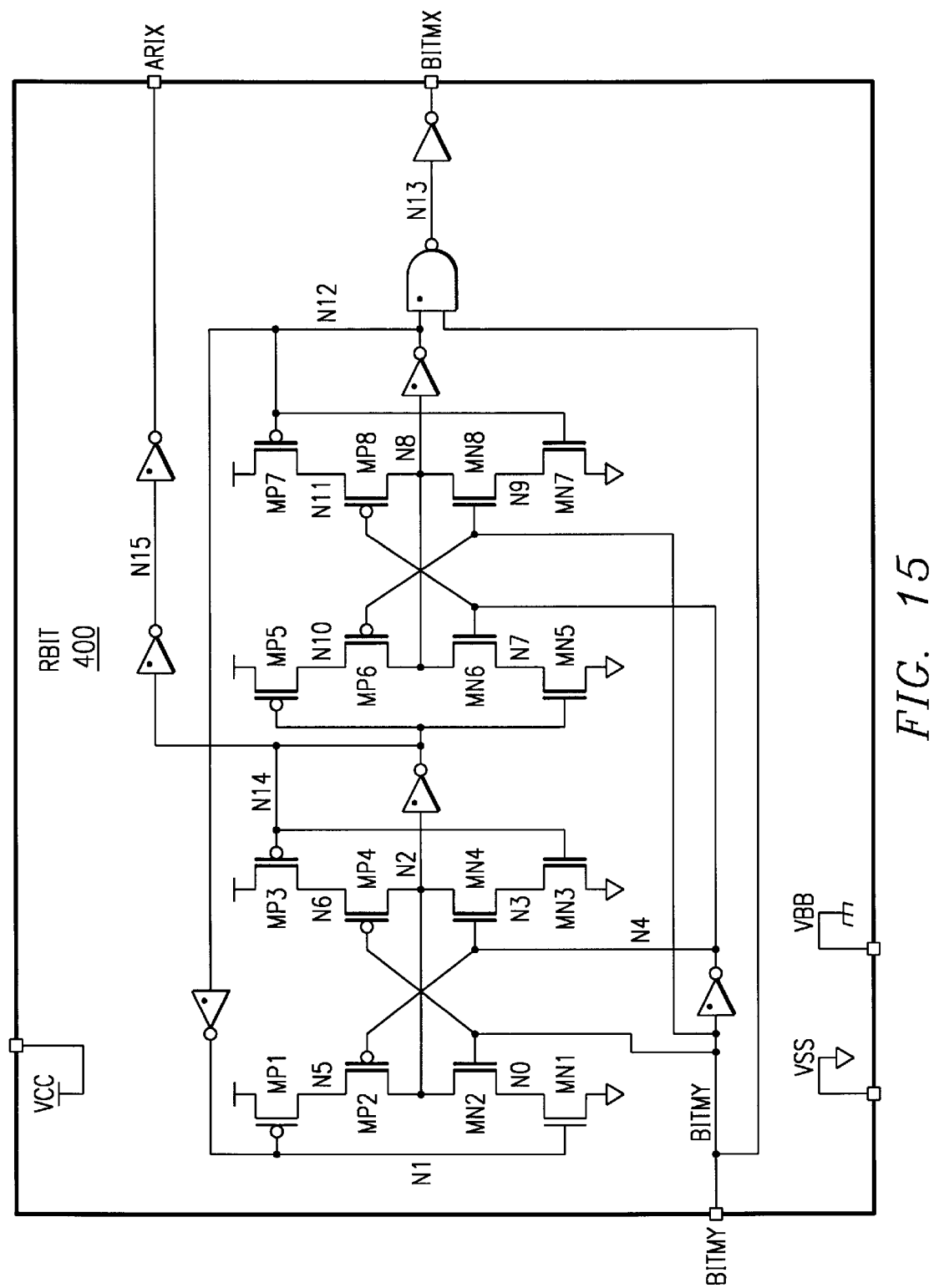

FIG. 14 is a schematic diagram of the counter stage 1302 shown in FIG. 13. Counter stage 1302 is responsible for the highest order row address bit, A11. A logic high SELFREF signal causes the incoming bit, CTRINC, to flow through counter stage 1302 to the carry-out line BITM11C. BITM11 and BITM11_ are the true and complement of the A11 address bit. FIG. 15 is a schematic diagram of one of the eleven counter stages 1300 shown in FIG. 13. The stage accepts a carry-in input signal BITMY and produces an address output ARIX and a carry-out signal BITMX. Address bits ARI(0:10) are latched at a later point in the address path, so they can transition during a row active cycle. RA2T and RA2B, the Bank 0 and 1 row activation signals, latch BITM11.

Figure 16:
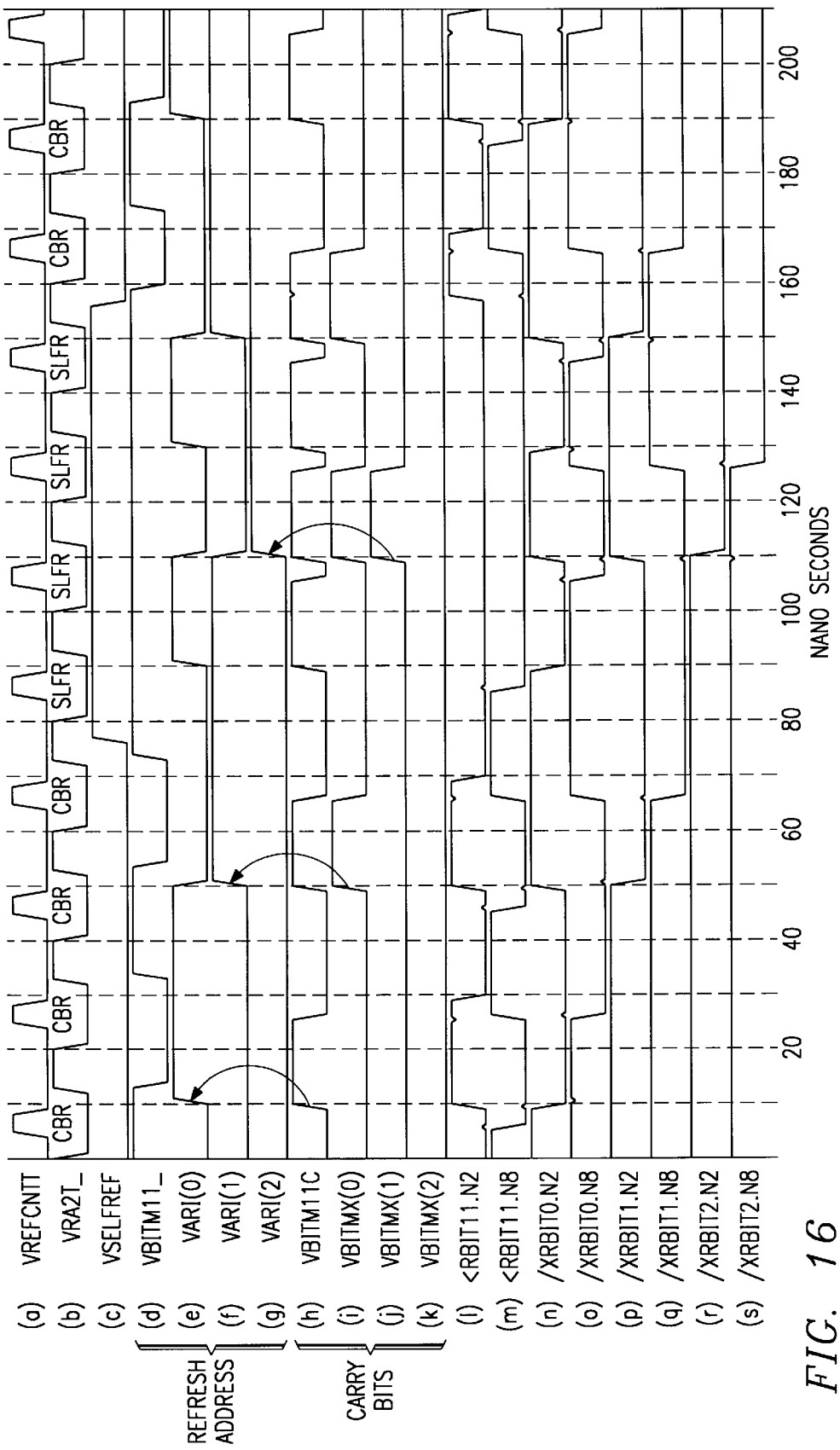
FIGS. 16 and 17 show voltage waveforms for input signals, output signals, and intermediate nodes in the circuits of FIGS. 13, 14, and 15 for four CBR refresh cycles, followed by four self-refresh cycles, followed by four CBR cycles.
Figure 17:
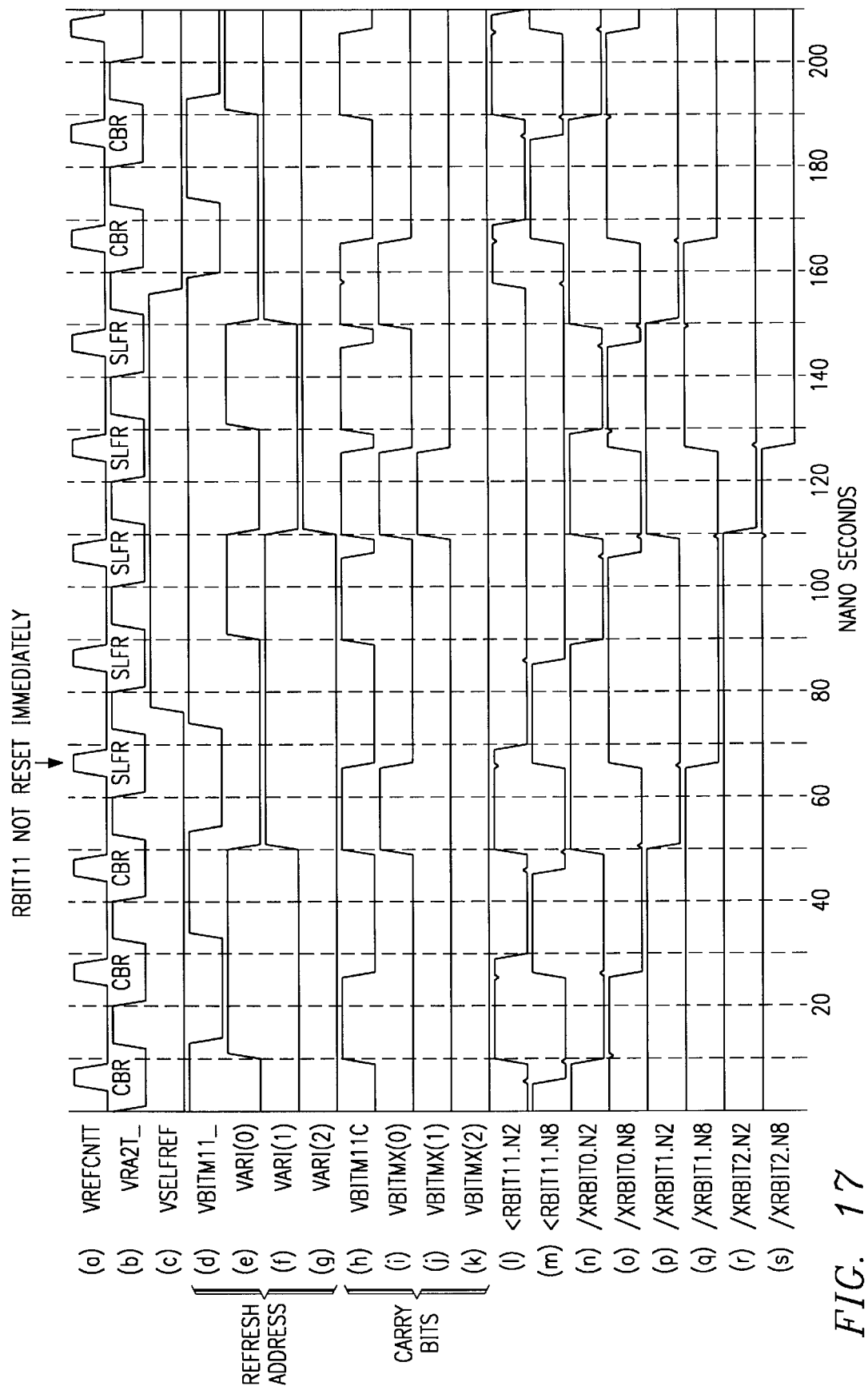

The operation of the circuits of FIG. 13, 14, and 15 may be better understood by referring to the timing diagrams shown in FIGS. 16 and 17. FIGS. 16 and 17 show the operation of the counter when changing from CBR refresh mode to self-refresh mode and back to CBR refresh mode. In FIG. 16, line (a) is the refresh count increment signal for Bank 0, which in this case indicates that four CBR cycles are followed by four self-refresh cycles, which are then followed by two more CBR cycles. Line (b) is the row activation signal for Bank 0. Line (c) is the self-refresh signal, which toggles after four CBR counts in this case. Line (d) shows the toggling of the most significant address bit, which is treated, as described above, as the least significant counter bit. Thus, it toggles with each falling edge of the VREFCNTT signal, but is ignored when the VSELFREF signal is high. Lines (e), (f), and (g) are the refresh addresses A0, A1 and A2, respectively. Only three of the eleven such address signals are shown here. Line (h) is the carry-bit signal of the A11 counter stage. Notice that the bits flow through during self-refresh mode. Lines (i), (j), and (k) are the carry bits for counter stages that produce addresses A0, A1, and A2. Lines (l) through (s) show the node 2 and node 8 voltage waveforms in the A11, A0, A1, and A2 counter stages. As shown in FIGS. 14 and 15, node 2 is the output node of the first set of tristateable inverters and node 8 is the output of the second set of tristateable inverters of the counter stages.

One aspect of this embodiment is that the A11 counter stage 402 is not forced into a reset state when SELFREF goes high, but rather it is allowed to toggle into the reset state where it is held. This can be seen by comparing lines (c) and (m) of FIG. 17. Note that the SELFREF signal goes high when XRBIT11.N8 (the voltage at node 8 in FIG. 14) is low, but XRBIT11.N8 toggles once more before staying low as one would expect in self-refresh mode. This approach helps to avoid anomalies in which the counter increments prematurely. Another approach is to have the counter wait until a load signal (LCBR) is low before incrementing, as in the second preferred embodiment described above.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. For example, the instant invention is not restricted to a single most significant don't care bit for multiple refresh modes. Two or more don't care bits may be used for 2048 and 8192 cycle or other refresh modes. Furthermore, the don't care bits need not be relegated to least significant status in the refresh counter.

Moreover, the embodiment memory circuits described herein could be embedded on an integrated circuit with a processor such as a microprocessor or digital signal processor. It is therefore intended that the appended claims encompass any such modifications or embodiments.

What is claimed:

1. A circuit, comprising:
 a counter circuit, coupled to receive a control signal and an incrementing signal, for producing a plurality of bits, at least one bit having a first value, responsive to a first logic state of the control signal for any cycle of the incrementing signal, the at least one bit alternating between the first value and a second value, responsive to a second logic state of the control signal for each cycle of the incrementing signal; and a decoder circuit, coupled to receive the plurality of bits, for producing at least one select signal for the second logic state of the control signal, the decoder circuit producing at least twice as many select signals for the first logic state of the control signal as for the second logic state of the control signal.

2. A decoder circuit as in claim 1, further comprising a first row decode circuit and a second row decode circuit, each row decode circuit producing a respective said at least one select signal, wherein the first value selects the first row decode circuit and the second row decode circuit and wherein the second value does not select at least one of the first row decode circuit and the second row decode circuit.

3. A decoder circuit as in claim 2, wherein the first row decode circuit is arranged to select a row of memory cells in a first memory array and wherein the second row decode circuit is arranged to select a row of memory cells in a second memory array.

4. A decoder circuit as in claim 3, wherein the first memory array is spaced apart from the second memory array by at least a third memory array.

5. A circuit as in claim 1, wherein the at least one bit is a most significant bit corresponding to the first logic state and wherein the at least one bit is less than a most significant bit corresponding to the second logic state.

6. A circuit as in claim 4, wherein said less than a most significant bit is a least significant bit.

7. A circuit as in claim 1, further comprising circuitry arranged to preserve a logic state of the plurality of bits during a transition of the control signal.

8. A circuit as in claim 1, wherein the counter circuit produces a refresh address for a synchronous dynamic random access memory and wherein the at least one select signal selects at least one row of memory cells.

* * * * *